(12) United States Patent
Vella

(10) Patent No.: US 6,670,623 B2
(45) Date of Patent: *Dec. 30, 2003

(54) THERMAL REGULATION OF AN ION IMPLANTATION SYSTEM

(75) Inventor: Michael C. Vella, San Leandro, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 183 days.

This patent is subject to a terminal disclaimer.

(21) Appl. No.: 09/800,643

(22) Filed: Mar. 7, 2001

(65) Prior Publication Data

US 2002/0130278 A1 Sep. 19, 2002

(51) Int. Cl.$^7$ .................................................. H01J 3/02
(52) U.S. Cl. .......................... 250/492.21; 250/423 R; 315/111.21; 315/111.31; 315/111.81
(58) Field of Search .................... 250/423 R, 492.21, 250/427; 315/111.21, 111.31, 111.81

(56) References Cited

U.S. PATENT DOCUMENTS

| | | | | |
|---|---|---|---|---|
| 5,352,899 A | * | 10/1994 | Golovanivsky et al. | 250/492.21 |
| 5,520,538 A | * | 5/1996 | Muka | 432/205 |
| 5,640,020 A | * | 6/1997 | Murakoshi et al. | 250/492.21 |
| 5,661,308 A | * | 8/1997 | Benveniste et al. | 250/492.21 |
| 5,663,488 A | | 9/1997 | Wang et al. | |
| 5,886,355 A | * | 3/1999 | Bright et al. | 250/492.21 |
| 5,977,552 A | * | 11/1999 | Foad | 250/492.21 |
| 6,013,332 A | | 1/2000 | Goto et al. | |
| 6,084,240 A | | 7/2000 | Lin et al. | |
| 6,239,440 B1 | * | 5/2001 | Abbott | 250/423 R |
| 6,288,403 B1 | * | 9/2001 | Horsky et al. | 250/427 |
| 6,545,419 B2 | * | 4/2003 | Vella | 315/111.21 |

FOREIGN PATENT DOCUMENTS

JP 10-163123 6/1996

OTHER PUBLICATIONS

U.S. patent application Ser. No. 09/596,828.

* cited by examiner

Primary Examiner—John R. Lee
Assistant Examiner—Paul M. Gurzo
(74) Attorney, Agent, or Firm—Margaret Chappuis; Marianne Fuierer

(57) ABSTRACT

A thermoregulation system for an ion implantation system to reduce the temperature in the ion implanter and components therein, or attached thereto, to a temperature at which an ion source material, used in the ion implanter, has a vapor pressure that yields a reduced concentration of vapors. Such arrangement markedly reduces the risk of exposure to harmful vapors from the ion source material.

26 Claims, 9 Drawing Sheets

THERMAL REGULATION OF AN ION IMPLANTATION SYSTEM

GOVERNMENT RIGHTS IN INVENTION

Some aspects of this invention were made in the performance of U.S. Government Contract No. DE-AC03-76SF00098. The U.S. Government has certain rights in the invention hereof.

BACKGROUND OF THE INVENTION

1. Field of the Invention

The present invention relates to an ion implantation system, and more particularly, to thermal regulation of an ion implantation system to reduce the temperature therein and to minimize the risk of exposure to harmful vapors.

2. Description of the Related Art

Numerous semiconductor manufacturing processes employ ion implantation for forming a p-n junction by adding dopants (impurities), such as boron (B) and phosphorus (P) to a semiconductor substrate. Ion implantation makes it possible to accurately control the concentration and depth of impurities to be diffused into a target spot on the semiconductor substrate.

Typically, an ion implanter includes an ion source that ionizes an atom or molecule of the material to be implanted. The generated ions are accelerated to form an ion beam that is directed toward a target, such as a silicon chip or wafer, and impacts a desired area or pattern on the target. The entire operation is carried out in a high vacuum.

The trend in semiconductor devices is to become smaller and thinner. As such, these smaller and thinner requirements challenge the ability of present systems to produce high dose ion beams with the low energy required to implant a high concentration of ions at a shallow depth in the semiconductor device Ion current (current density x area) and beam energy are the fundamental process variables for the implant step. Ion dose and implant range are the resultant device variables. Ion dose relates to the concentration of implanted ions in a semiconductor material. Moreover, the energy of the ion beam determines the depth of the implanted ions before the activation anneal step. The dose rate, and therefore, the process time is proportional to the beam current. Ideally, dose rate and beam energy would be independent process variables. This is somewhat true for high energy beams used for deep implants. However, low energy ion beams are used for shallow implants, but, for standard dopant atomic ions at low beam energies, ion current is constrained by physics limitations associated with extraction and transport losses Present ion implanters operate best at energies from about 10 keV to about 2 MeV. Shallower implant of ions will require similar beam currents as present implanters, but at much lower energies, e.g., from about 2 keV down to hundreds of eV. However, as beam energy decreases to accommodate thinner devices, beam transport of standard ions, defined as dopants, such as boron ($B^+$), arsenic ($As^+$) and phosphorus ($P^+$), becomes inefficient due to beam space charge. Beam space charge may be defined as the repelling of like charges in the ion beam causing an expansion of the ion beam during transport to the target. As a result, beam transmission is greatly reduced when the energy level is reduced.

The possibility of producing useful currents of a heavy gas phase molecular ion offers significant advantages over ion source material presently used in implanters. For example, using the heavy gas molecular ion decaborane ion ($B_{10}H_{14}^+$), which has ten boron atoms has advantages for low energy, high current dopant beam transport. First, the energy for each individual boron nucleus is one tenth the energy of the ion, making it possible to extract and transport at approximately ten times the beam energy. For example, a 10 keV beam of $B_{10}H_{14}^+$ would deliver dopant at less than 1 keV per boron atom. Second, the dopant current is ten times the ion current. As such, only about 1 mA of $B_{10}H1_{14}^+$ is needed to deliver 10 mA of boron.

Thus, it would be advantageous to provide an ion source that produces heavy ions with multiple dopant atoms per ion, at a sufficient dose (current density) to be effective as an ion in an implanter system, especially for shallow depths.

However, the use of heavy molecular ions, such as decaborane, creates some unique health and safety challenges. For example, the vapor pressure of decaborane is low at room temperature (at the threshold limit value), and can be hazardous at modestly elevated temperatures. This fact is relevant and must be addressed during routine servicing of ion implanters, and especially ion sources.

Since acceleration is accomplished by application of electric fields, particles must first be charged. Charged particles are generated by an ion source, which typically is a plasma device. Several types of ion sources are commonly used in commercial ion implantation, including a Freeman and Bernas types using thermoelectrodes and powered by an electric arc, a microwave type using a magnetron, and RF plasma sources. All of which typically operate in a vacuum. The arc sources operate at refractory temperatures.

Depending on the ion source type and usage, ion implant systems are routinely serviced on intervals of a few days to a few weeks. Due to the high cost of owning an ion implant system and the need to minimize down time, sources are frequently removed at temperatures significantly above room temperature. Toxic solids with thermally sensitive vapor pressure, like decaborane, are not routinely used at present, but the removal of a warm walled source with decaborane deposits would present a serious safety risk.

To minimize release of vaporized materials, during the cleaning of the ion source chamber or recharging the ion source material, the system must be allowed to cool before releasing the internal vacuum of the system. Opening the system before cooling to room temperature may introduce a number of serious health issues dependent upon the ion source materials. As described hereinabove, the use of decaborane, although not as hazardous as some, still creates some unique health and safety challenges. Although decaborane is reduced into harmless boron at refractory temperatures, at temperatures ranging between refractory and slightly about room temperature, the possibility of deposits on components of an ion implant system can pose a potential health hazard. As such, if the ion source chamber is not completely cooled to room temperature, or below, and decaborane deposits are present, an immediate health hazard is encountered. It should be noted that at room temperature, the decaborane health hazard is greatly reduced.

The implied cost of waiting hours for the ion source to cool to room temperature would be a significant barrier to adoption of decaborane technology in semiconductor manufacturing. Also, it is obvious that removing a decaborane ion source at elevated temperatures would create an immediate inhalation hazard to personnel. Also, evaporated decaborane could contaminate the surrounding work area.

Accordingly, it would be a significant advance in the art of ion implantation to provide a thermoregulation system that reduces the time required to cool the components of an ion implanter, thereby reducing the amount of time the implantation system is inoperative, while reducing the risk of exposure to hazardous material. In addition, implanter safety can also be improved by rendering the toxic materials into a non-toxic form.

SUMMARY OF THE INVENTION

It is therefore a principal object of the present invention to provide a thermoregulation system for an ion implanter that reduces the release of hazardous materials during servicing of the instrument or recharging the ion source.

Another object of the present invention is to reduce the time required to service an ion implanter instrument.

Still another object of the present invention is to provide a high-energy ion beam that provides shallow implantation of a dopant.

A further object of the present invention is to provide shallow implantation depth without the problems normally associated with a low energy beam, such as expanding of the ion beam and the resulting negative effects.

These and further objects are accomplished by ion implanter systems and methods disclosed herein.

One aspect of the present invention relates generally to a thermoregulation system for an ion implantation system that regulates the temperature of ion implanter components including, without limitation, the ion source, beamline components, vacuum lines, vaporizers and the like.

In one embodiment, this is accomplished by contacting at least one temperature regulating means to at least a section of an individual component of an ion implanter to control the temperature therein.

An essential element of an ion implantation system of the present invention is at least one temperature controlling means, and preferably a cooling device that contacts a component of the ion implanter. The cooling device regulates the temperature of an ion source having at least one interior chamber including, without limitation, a Bernas ion source, a Freeman ion source, or a double chamber charge exchange molecular ion source as disclosed in copending U.S. patent application Ser. No. 09/596,828, entitled "IMPROVED DOUBLE CHAMBER ION IMPLANTATION SYSTEM" the contents of which are herein incorporated for all purposes.

In one preferred embodiment of t he present invention, the ion source housing is connected to a cooling device to reduce the temperature of the housing structure, interior and components therein or attached thereto, to a temperature whereat the vapor pressure of the source material is considered safe and/or the risk of inhalation of vapors from the source material is acceptable.

The cooling device can be activated when servicing of the ion implanter is required or activated continuously during the ion implantation process.

In another embodiment, the ion source and other components of the ion implanter may include a temperature monitoring device to insure that the temperature is being reduced to an acceptable level while the cooling device is activated.

In yet another embodiment, a vapor monitor may be connected to the ion implanter at strategic components along a path of the generated ion beam including, without limitation, at a cool down vaporizer attachment to the ion source housing, an ion source housing, and output vacuum lines, to monitor and verify vapor concentrations of an ion source material and provide another safeguard against possible exposure to a hazardous gas.

A still further embodiment envisions a backup system to ensure that the ion source material has been rendered non-toxic. As in the case of decaborane, it is known that at temperatures above 300° C. decaborane is rendered non-toxic because of the reduction to harmless boron and hydrogen. Thus understood, it is further contemplated that the ion source compartment comprises a heating device that may be activated to ensure that any remaining source material, such as decaborane is completely reduced to harmless boron.

Other aspects, features and embodiments of the present invention will be more fully apparent from the ensuing disclosure and appended claims.

DETAILED DESCRIPTION OF THE INVENTION AND PREFERRED EMBODIMENTS THEREOF

The present invention provides for temperature control means in an ion implanter to reduce the chance of accidental exposure to harmful ion source material and to provide a more efficient and cost effective means for cooling the ion implanter before servicing or replacing material in an ion source.

Figure 1:
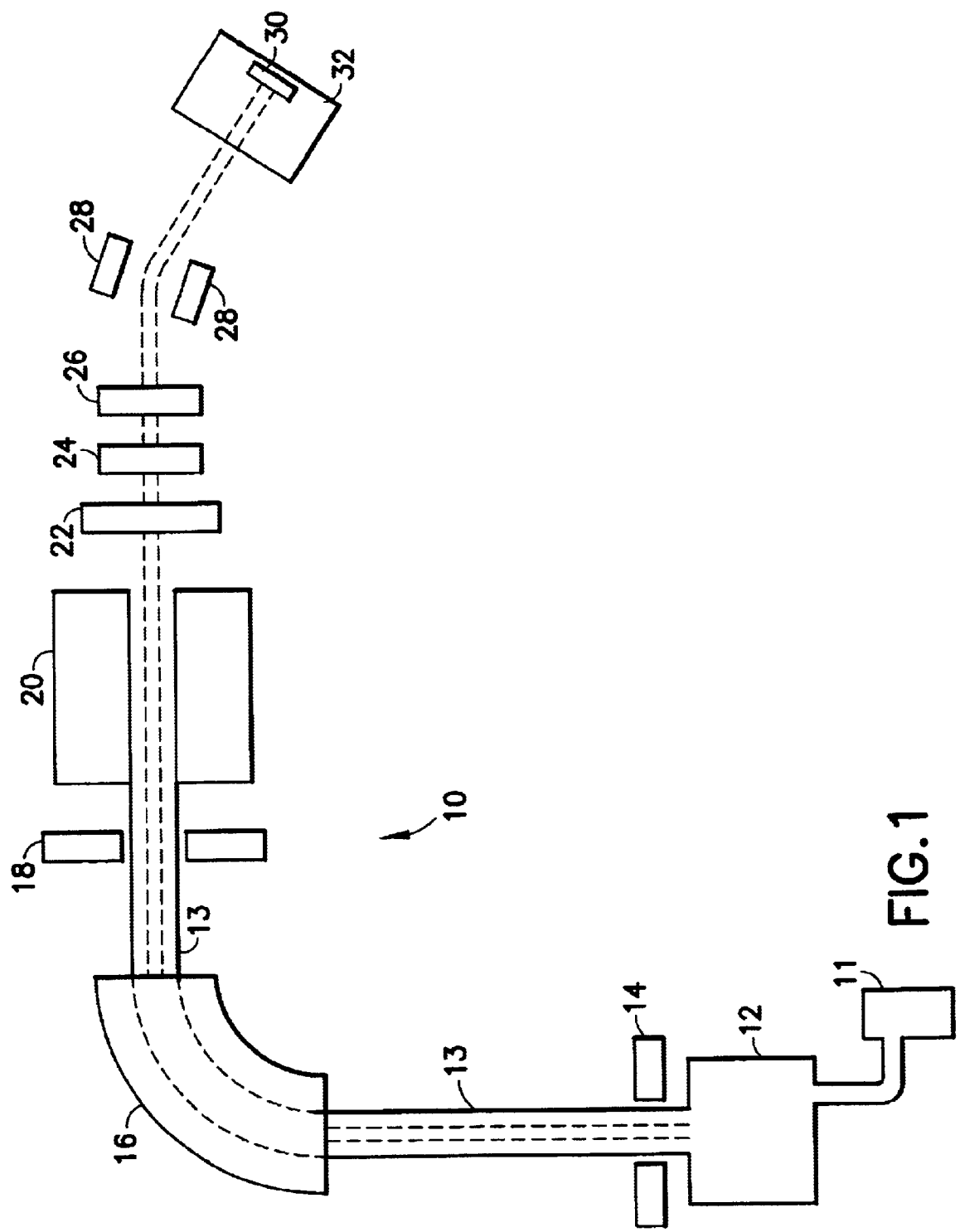
FIG. 1 is a cross-sectional view showing different components of an ion implanter of the prior art.

As depicted in FIG. 1, an ion implanter 10 typically includes an ion source 12 that generates ions. The ions are drawn by extracting electrodes 14 and their mass is analyzed by a separating electromagnet 16. The ions are separated by apertures 18 and may be further accelerated or decelerated by accelerators 20 to the final energy. A beam of ions is converged on a sample 30, may also be positioned in a target chamber 32, by quadrupole lens 22 and scanned by scanning electrodes 24 and 26 to uniformly distribute the ion beam on the target 30. Deflection electrodes 28 are designed to deflect the ion beam in order to eliminate uncharged particles caused by collision with residual gas. It should be noted that any of components 18, 20, 22, 24, 26, and 28 may be optional for any particular implanter.

FIGS. 2–5 show variations of different ion sources that have been modified according to the present invention to include a temperature controlling means that provides the ability to regulate the temperature of the modified ion sources.

Figure 2:
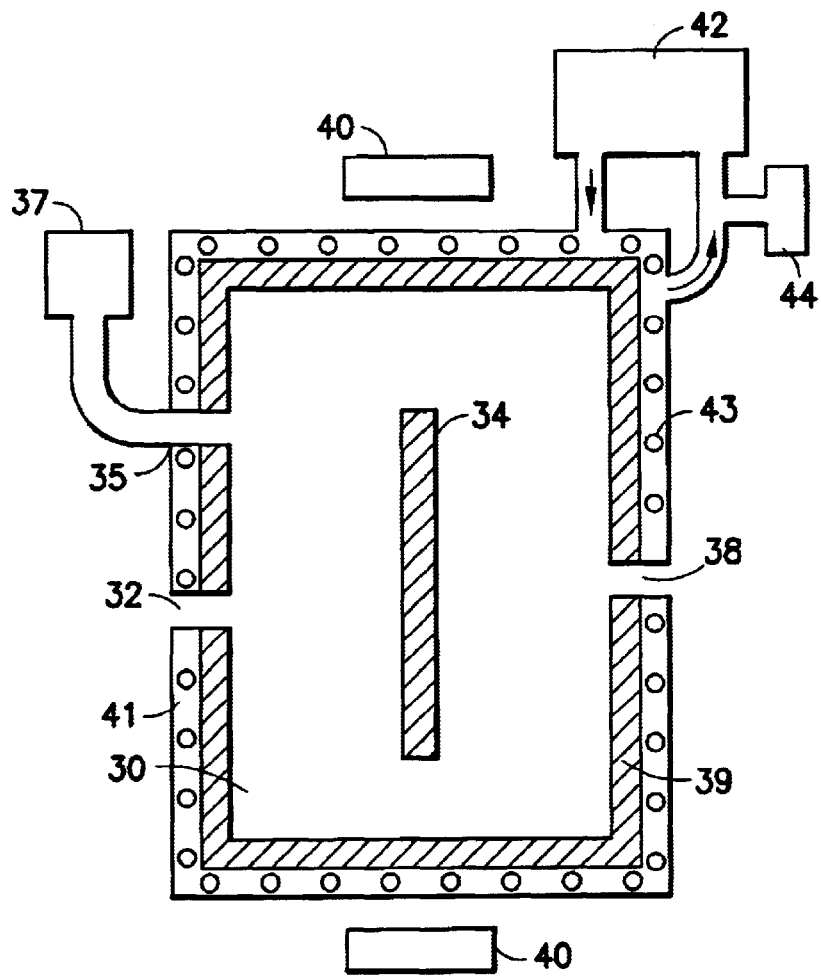
FIG. 2 is a cross-sectional view showing a Freeman type ion source (ion generation device) modified according to the present invention.

FIG. 2 shows a Freeman type ion source modified according to the present invention with the inclusion of a temperature regulating means. The Freeman type ion source generates plasma by emitting thermoelectrons from a rod-shaped filament 34, an magnetic field is generated parallel to the filament 34 by electromagnet 40, and electrons are moved in the chamber interior 30 to generate ions from the source material introduced at inline 32. These generated ions pass through slit 38 moving in a direction perpendicular to the filament 34. Housing 39 of the ion source is further surrounded by temperature controlling means 41 making contact with the housing Generally, any temperature controlling device that incorporates principals of heat transference to sufficiently cool the ion source and components therein to a temperature at which an ion source material exhibits a non-hazardous vapor pressure may be used in the present invention, including without limitation, cooling by heat transfer to a solid, liquid or gaseous media which is naturally or artificially colder, wherein the lower temperature of the solid, liquid or gas media stems from radiation, sensible- or latent-heat physical effects, endothermic chemical effects, thermoelectric effects, and/or magnetic effects. Effects such as cold streams, melting ice, and sublimating solid carbon dioxide are also included.

As shown in FIG. 2, housing 39, preferably fabricated from a thermally conductive material, is surrounded by a cooling device 41 that contacts housing 39 and acts as a heat sink to accept heat from the housing 39 thereby cooling the ion source and components therein. For example, cooling device 41 may be a complementary housing that encases ion source housing 39 and includes a piping system for transporting a heat absorbing fluid that accepts heat for transference to an outside source. The cooling device 41 need not necessarily surround the entire housing, it may be sufficient to be in contact with the sides. Also, the cooling lines may be built into the wall of the primary chamber, not two separate walls 39 and 41.

Figure 3:
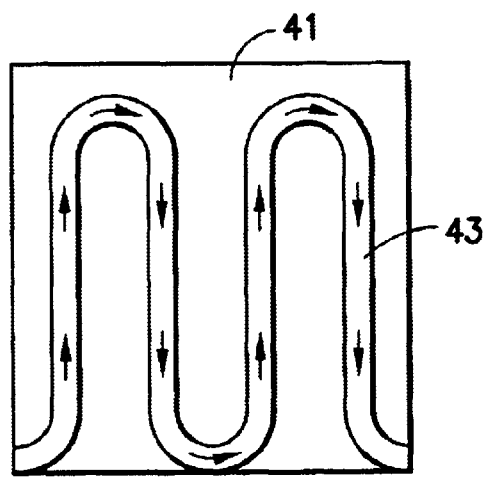
FIG. 3 is a side view of FIG. 2 showing a temperature controlling housing.

FIG. 3 illustrates a side wall of cooling housing 41 having included therein piping 43 for circulating a flow of heat absorbing fluid. The choice of the heat absorbing fluid will depend upon the temperature range in which it must operate. In the present system, wherein the ion source is heated to refractory temperatures, it may be appropriate to use an indirect cooling system wherein the heat absorbing fluid is a heat resistant oil, such as mineral or cotton seed oil; or a brine; or freon type fluid, all of which have high heat capacity. The fluid, having heat-absorption capabilities, is moved through piping system 43 to accept heat and then circulated to a vapor-compression cooling system 42 for cooling by contact with an evaporator surface therein. The heat absorbing fluid may be recirculated continuously until the ion source has reached an acceptable temperature.

The temperature of the interior of the ion source may be monitored by a temperature sensing means 44 that may be positioned directly in contact with the housing 39, disposed within the interior chamber 30 or positioned by vapor compression cooling system 42 for monitoring the temperature of the heat absorbing fluid before entering the vapor-compression system. The temperature sensing means may be engaged through a small opening in the housing wall or fluid piping 43 to sense the interior temperature and provide electrical signals indicative of the temperature of the interior chamber. Further, when an acceptable temperature is reached, a indication light or sound alarm may be included to alert users of the instrument of the lowered temperature.

Additionally, a sampling port 35 may be connected to a gas composition analyzer 37 to determine the level of residual vaporized gas remaining in the interior chamber. Any gas analyzer that can determine the level of residual gas and known to those skilled in the art may be utilized. Typically, the gas composition analyzer 37 may be connected to a main vacuum system, or the source.

Figure 4:
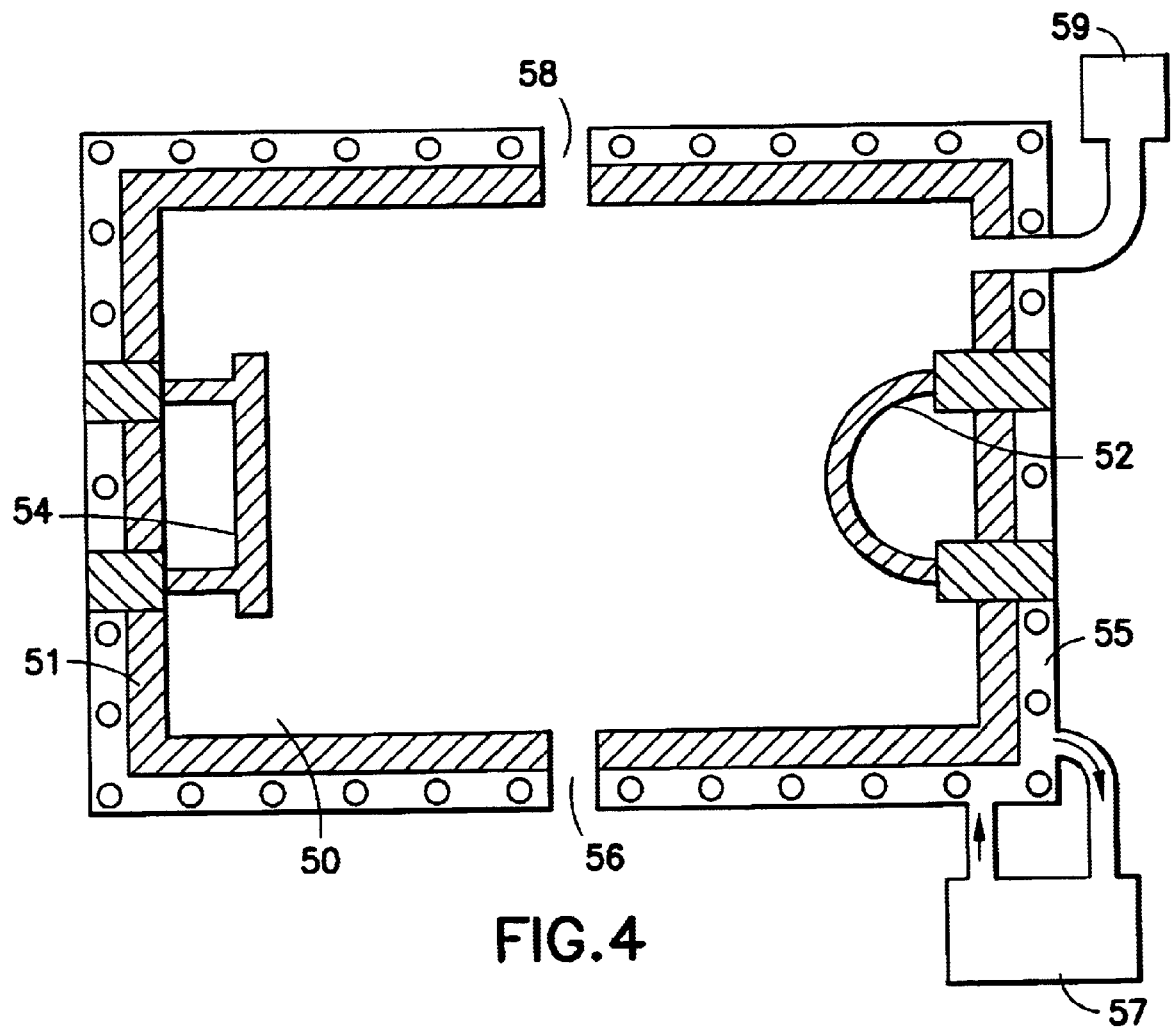
FIG. 4 is a cross-sectional view showing a Bernas type ion source modified according to the present invention.

FIG. 4 is a cross-sectional view of a Bernas type ion source. The interior chamber 50 formed by housing 51, preferably fabricated from a thermally conductive material, includes a thermionic filament 52 and an opposing electrode 54 that may be electrically biased, or, floating. Since refractory temperatures are damaging to decaborane and lower arc currents than normal are preferred, the charge exchange ion source may benefit from a non-tungsten filament that produces less arc current but operates at lower temperature. The chamber is supplied with gas at input 56. The filament emits thermoelectrons that ionize the gas and the gas ions are extracted at aperture 58 to be accelerated. The Bernas type ion source modified according to the present invention includes a temperature regulating device that includes cooling housing 55 and a vapor-compression cooling system 57. This embodiment may be fitted with temperature and gas monitoring sensors as discussed hereinabove and shown as 59.

Figure 5:
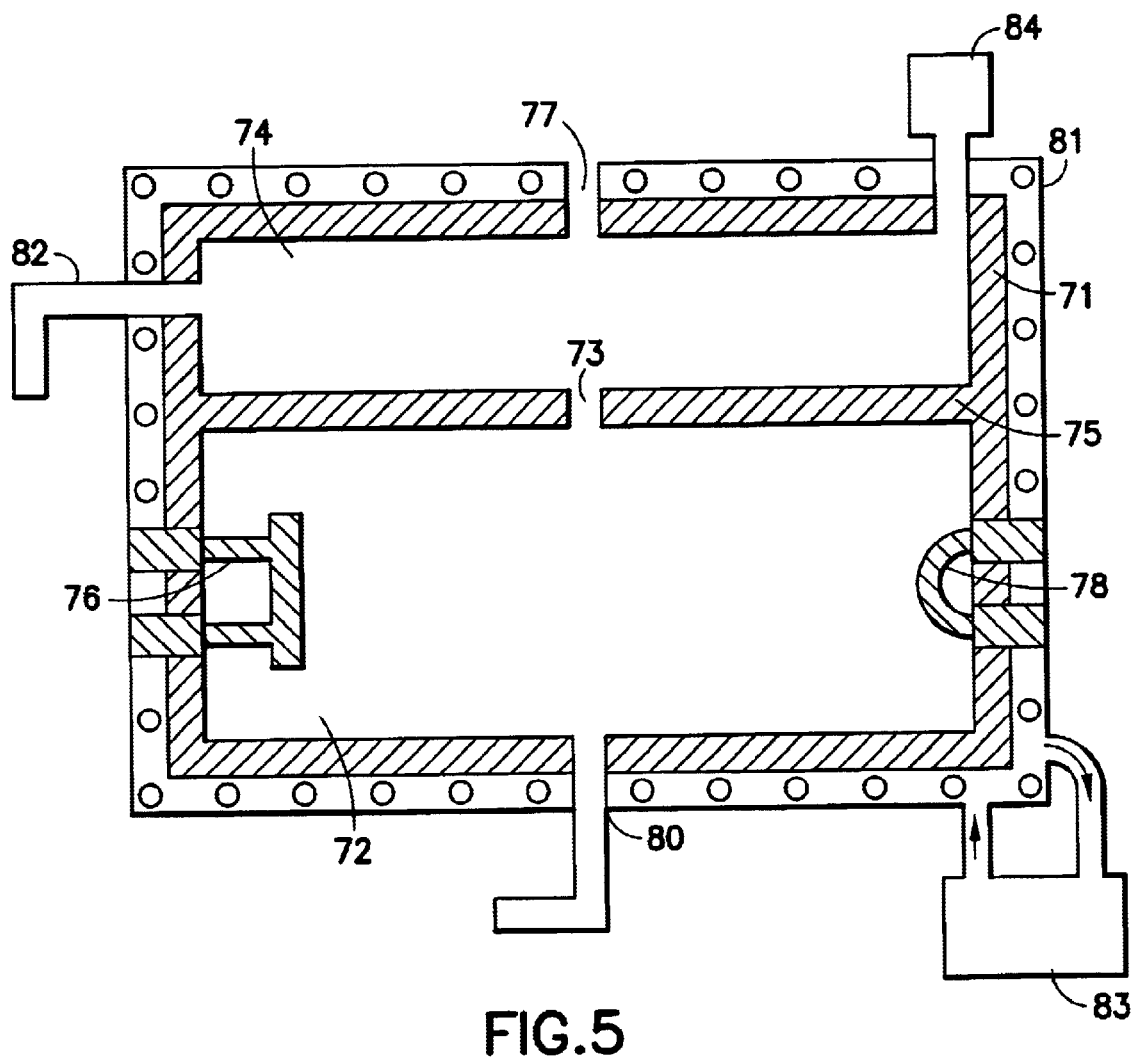
FIG. 5 is a cross-sectional view showing a double chamber charge exchange ion source modified according to the present invention.

FIG. 5 is a cross-sectional view of a double compartment charge exchange ion source modified according to the present invention. The charge exchange double compartment ion source, shown in FIG. 5, provides advantages not found in single chamber ion source equipment. In single chamber ion sources, the phenomenon of charge transfer, or electron charge exchange has long been known because the process affects the ion species mix. Specifically, a charge transfer involves a collision between a neutral particle and a singly charged ion as shown below:

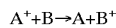

where A, B denote neutral particles in the ground state, and the superscript "+" indicates a single positive charge state. In this case, ion B+ is created by an electron transfer from atom B to ion $A^+$. Charge exchange between ions and neutral atoms is a natural process that occurs whenever ions and gases are mixed. However, when attempting to produce heavy molecular ions in standard single compartment ion source of the prior art, to be used for doping several mechanisms can be present in single chamber sources that tend to breakup the molecules, for example, collisions with energetic electrons, collisions with hot gas particles, contact with hot components such as filament or walls, plasma radiation, and filament radiation. Each of these can cause heavy molecules to break apart before they are ionized and/or implanted on the target substrate.

Thus understood, the double chamber ion source of FIG. 5 provides for ionization of heavy molecules by charge exchange with an ion A+ and a neutral heavy molecule, MOL as shown below:

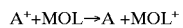

where the heavy molecules are ionized by charge exchange with the ions $A^+$. At the same time, the cool walls, absence of a hot filament, and physical divider barrier 75 serve to reduce electron energy, gas temperature and radiation that can destroy heavy molecular ions. In the present context, it should be understood that the charge exchange process can create gas phase ions from any material particle, including atoms, molecules, cluster or any other group of multiple nuclei.

The illustrated two compartment chamber of FIG. 5 is a standard Bernas ion source modified according to the present invention by inserting an separation plate 75 with an aperture to form a first chamber 72 which is the primary plasma chamber and a second chamber 74, which is the charge transfer chamber. A plasma forming gas may be introduced into the plasma chamber 72 at gas feed source 80, or, the primary plasma can be formed from gas the diffusing into chamber 72 from charge transfer chamber 74. Heavy gas molecules MOL that are to be ionized, are introduced into the charge transfer chamber 74 through gas feed source 82. Energetic primary electrons generated by filaments 76 and 78 in the plasma chamber 72 will generate primary ions $A^+$ ions. These ions will drift through aperture 73 in plate 75 into the charge transfer chamber for charge exchange with the MOL. As a result of charge exchange, molecular ions $MOL^+$ are produced. As the $MOL^+$ ions are extracted, at extraction aperture 77, they are accelerated to form a $MOL^+$ ion beam current.

Figure 5A:
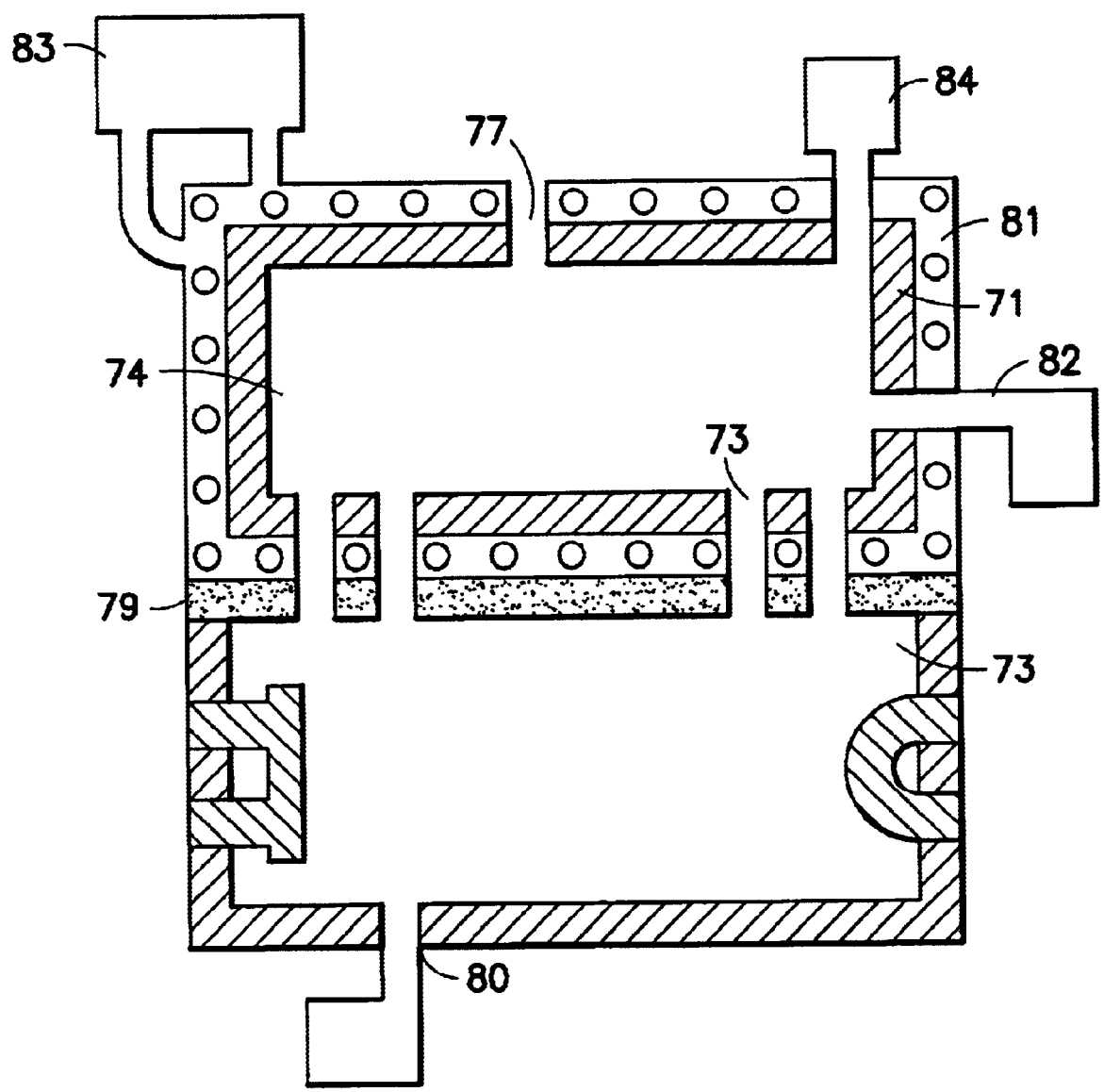
FIG. 5A is a cross-sectional view showing another preferred embodiment of a double chamber charge exchange ion source modified according to the present invention.

It is a feature of the present invention that aperture plate 75 serves to maximize the molecular gas density in chamber 74 and to isolate molecular gas from plasma radiation, primary electrons, and heat in the plasma chamber 72 thereby minimizing non-preferred interactions and enhancing the charge transfer between the plasma chamber 72 and charge transfer chamber 74. It has been found that the design and placement of aperture 73 can be refined to optimize the relative flux of primary ions from plasma chamber 72 into charge transfer chamber 74 relative to the gas flux flowing between the two chambers as shown in FIG. 5A. Specifically, apertures 73 are positioned near terminal ends of the divider 75 and the center area is devoid of apertures. This positioning of the apertures increases the ratio of forward ion flow to reverse gas flux.

With the addition of a temperature controlling device, to the double compartment ion source of FIGS. 5 and 5A, any concern regarding exposure to hazardous materials is greatly reduced. Housing 71, which provides a cavity for the two compartments is surrounded by a cooling jacket or housing 81. This cooling device may include the cooling pipe system as shown in FIG. 3 wherein a heat absorbing fluid is circulated through the piping system with removal of absorbed heat by contact with an evaporator of a vapor-compression cooling system 83. This embodiment may be fitted with temperature and gas monitoring sensors as discussed hereinabove and shown as 84.

Alternatively, another aspect of the present invention provides for only the charge transfer chamber 74 to be contacted by a cooling device as shown in 5A Also, FIG. 5A shows divider barrier 75 fabricated of an electrically insulating material 79 that electrically separates the two chambers. This allows the double chamber ion source to be operated in common mode, like FIG. 5, or, with the charge transfer chamber electrically isolated or biased with respect to the plasma chamber. Also, the divider barrier 75 may be cooled or alternatively include a heat shield insert positioned on either side of divider 75.

In a preferred embodiment of the invention, decaborane ions are produced by charge exchange. Hydrogen, argon, or other ions are produced in the plasma chamber 72. These ions then charge exchange with decaborane molecules in the charge transfer chamber 74 to produce decaborane ions. The advantage of decaborane ions is that they contain ten boron atoms. Thus, the boron atom energy is about one tenth of the decaborane ion energy and the boron atom current is about ten times the decaborane ion current. As a result, the ion source produces high current, low energy boron dopant beams that are suitable for shallow junction type devices.

Having described a preferred embodiment, it is to be understood that the description was for purposes of illustration only and that all modifications and alterations that come within the scope of the appended claims are intended to be included herein. For example, the principal of charge exchange in the double compartment ion source of the present invention can be similarly transferred to other molecules. The example of decaborane involves positive ions, but similar processes occur for atoms and molecules that have negative charge species. Positive ions are more likely to be of interest for ion implant applications, and as such, were used as a non-limiting example.

The same problem that exists in the ion source chamber, that being elevated temperatures that may cause ion source material to vaporize, and the need to quickly change an ion source material or service the instrument, may also occur in vacuum vaporizers used in conjunction with ion sources. Accordingly, another aspect of the present invention provides for a cooling system adaptable for inclusion in a vacuum vaporizer.

Typically, when using a solid for an ion source material, such as $B_{10}H_{14}$ or InCl, the ion source comprises at least one vaporizer 11 as shown in FIG. 1. A vaporizer generally includes a crucible in which a solid element or compound is placed and which is subsequently heated by a heating means to vaporize the solid material. The vaporized gas passes into the interior chamber of the ion source for ionization.

Figure 6:
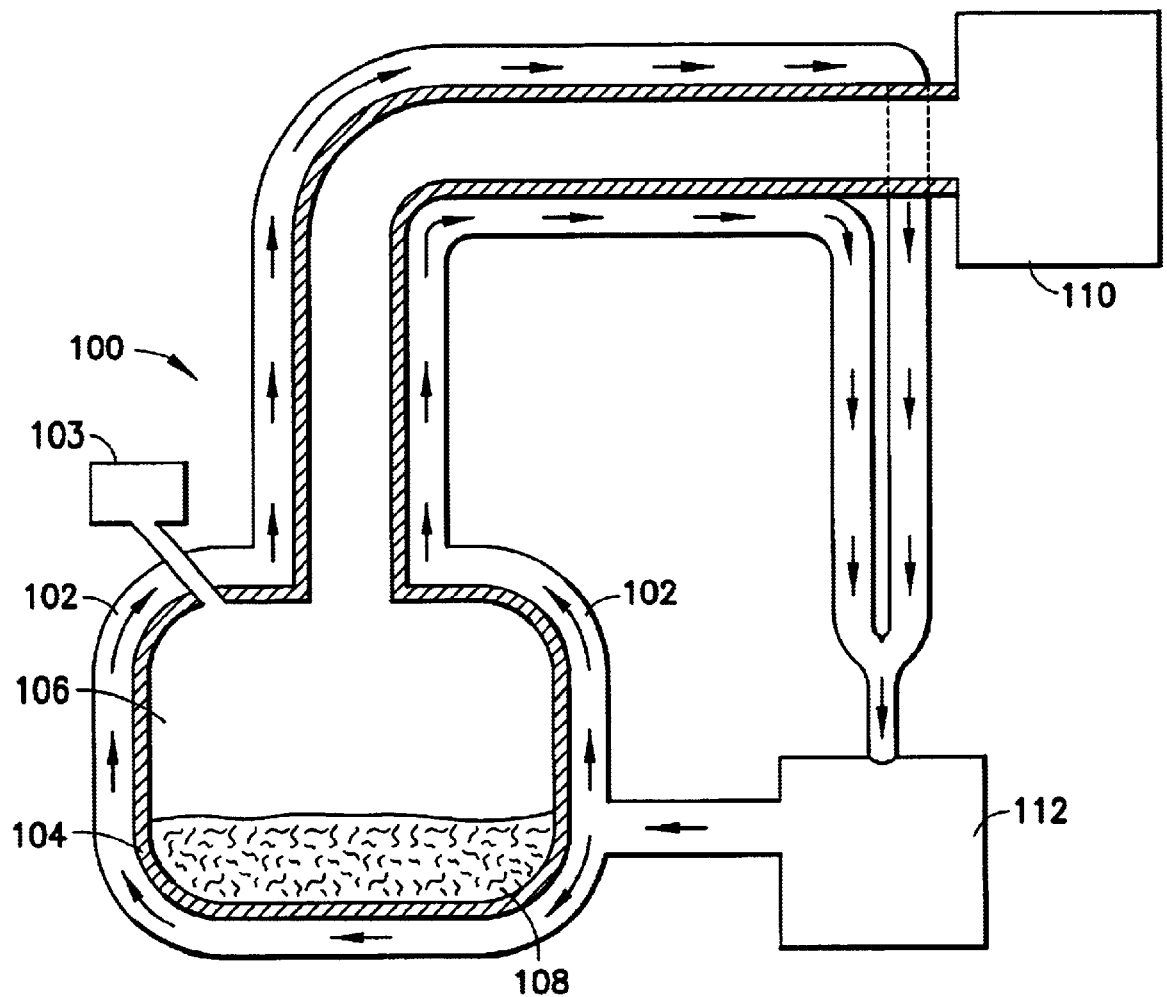
FIG. 6 is a cross-sectional view showing a vaporizer modified according to the present invention.

As shown in FIG. 6, a vaporizer 100 is modified according to the present invention to provide a cooling jacket or housing 102 that substantially surrounds vaporizer housing 104. Interior chamber 106 contains solid ion source material 108 that when exposed to heat is vaporized and migrates to an ion source 110. The ion source chamber is shown separated from the vaporizer but it should be recognized that a vaporizer may be integral to an ion source.

During servicing of the instrument or recharging the ion source material, the heating and vaporization process is discontinued and a cool down period commences. According to the present invention, the cooling down period can be reduced by providing additional cooling means to speed the process.

As shown in FIG. 6, the vaporizer housing 104, preferably fabricated from a thermally conductive material, is surrounded by a cooling jacket 102 that provides a pathway for heat absorbing fluid to pass therethrough. The heat absorbing fluid may be any fluid known to those skilled in the art that has the stability to withstand refractory temperatures and absorbs sufficient heat to efficiently transfer excess heat from the vaporizer to an outside source through a vapor-compression cooling system 112. The flow rate of the fluid may be controlled and determined by the heat absorbing capability of fluid. The temperature of the vaporizer may be sensed by thermistors, thermocouples or other temperature sensing devices and shown as 103 The vaporizer may be heated directly, by means of separate heating elements, or, it may be heated indirectly, for example, by thermal contact with the primary plasma chamber.

It is further contemplated that certain areas of the beamline 13, as shown in FIG. 1, would benefit by temperature cooling means because this region can reach temperature above 20° C., and as such could present problems of hazardous exposure during servicing of the instrument. This is especially beneficial to speed the cooling of the extraction electrodes 14, ahead of the analysis magnet, where vaporized decaborane can accumulate. Thus the beamline region, from the ion source 12 to the analyzer 16, may be housed in a cooling structure that provides the ability to quickly cool the area to an acceptable temperature for reducing vaporization of the ion source material.

Figure 7:
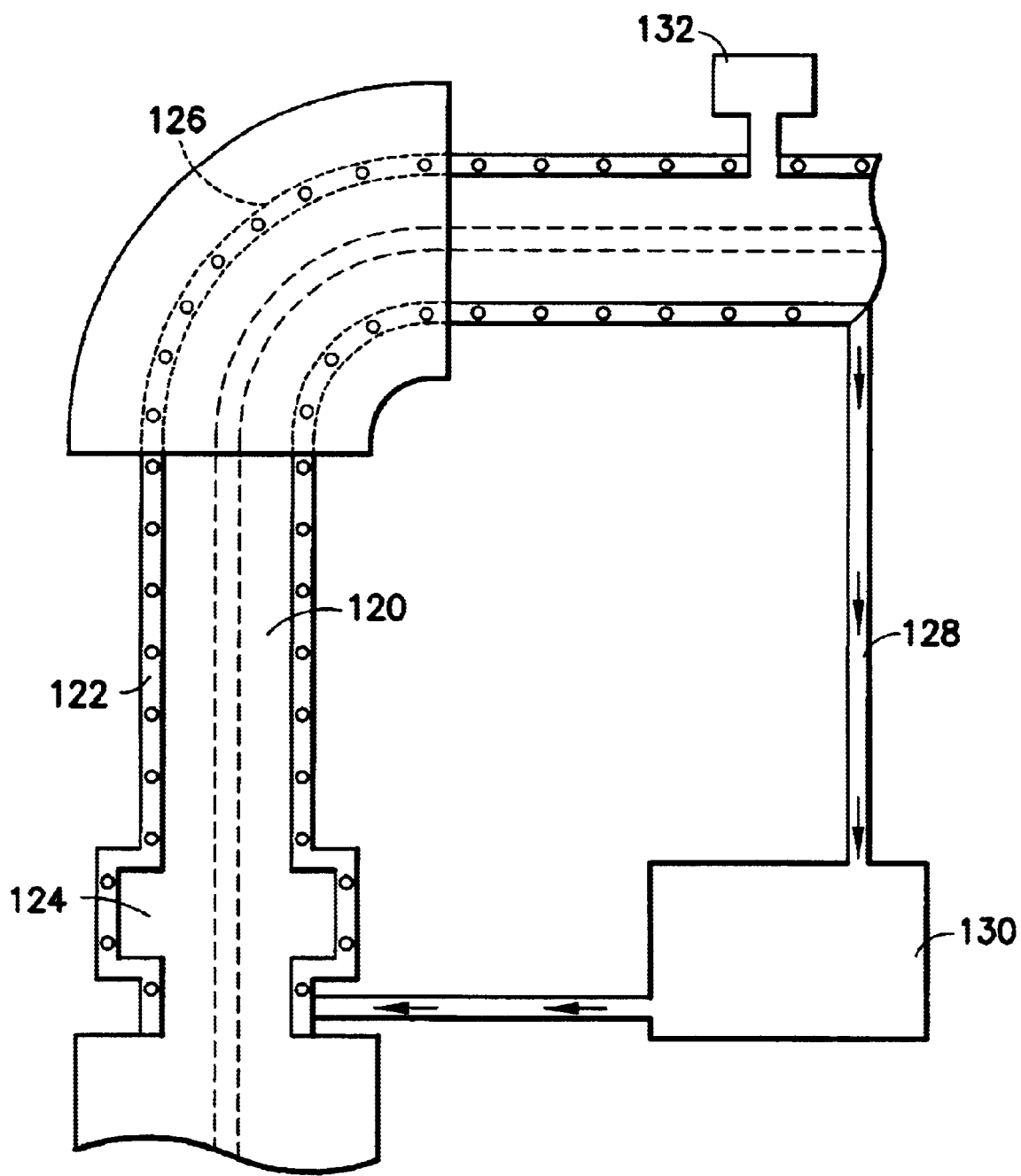
FIG. 7 is a cross-sectional view showing a beamline structure and path an ion beam modified according to the present invention.

As shown in FIG. 7, the beamline 120 may be contacted with a cooling jacket 122 that provides means to remove excess heat from the region. Specifically, the jacket may include a tubing 128 in which a heat absorbing fluid flows thereby cooling the region by the extraction electrode 124 and the beamline 120 through the analyzer 126 to the accelerator. It should be noted that only the pre-accelerator part of the beamline needs to be cooled, not the entire beamline. The absorbed heat in the fluid flowing through tubing 128 is transferred to an outside source in the vapor-compression system 130. This embodiment may further be fitted with temperature and gas monitoring sensors as discussed hereinabove and shown as 132.

Figure 8:
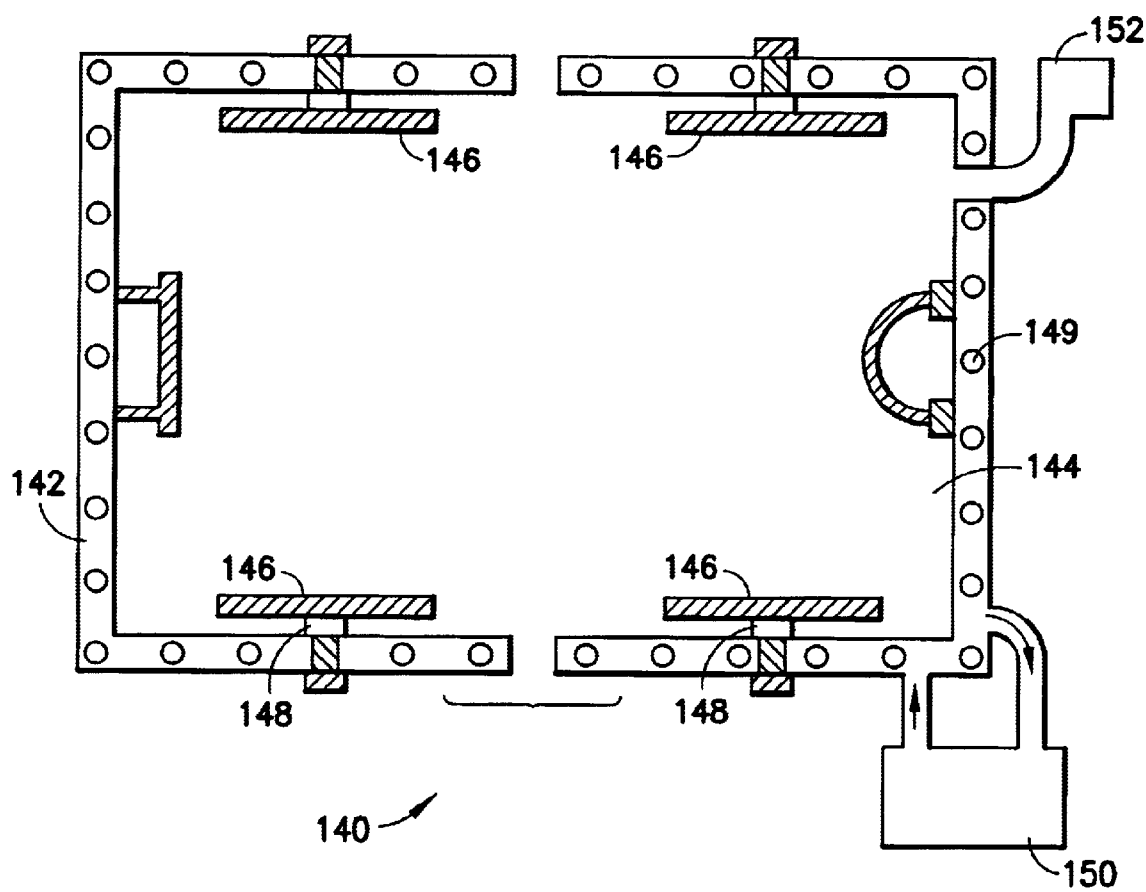
FIG. 8 is a cross-sectional view showing an ion source modified with a cooling device and additional heating elements.

When working with an ion source material, that may present exposure to hazardous materials, it is further contemplated that decontamination procedures, to render the ion source material as non-toxic, may be implemented before servicing the instrument or recharging an ion source. The decontamination process should be completed before cooling of the ion source. Decontamination may be accomplished by heating to a sufficient temperature to effectively cause the breakup of any remaining decaborane vapor into its constituent boron atoms. As such, a heat regime, before servicing, could ensure that any remaining decaborane is in a non-toxic state. Thus understood, a still further embodiment provides for heating elements to be positioned within the ion source chamber as shown in FIG. 8.

Any of the above described ion source chambers may be modified accordingly, especially the charge transfer chamber. FIG. 8 discusses the heating elements arranged in a Bernas-type source. Specifically, ion source 140 comprises an outer housing 142 that includes a cooling system for cooling to an acceptable temperature below which harmful vapors will not form in the interior chamber 144. Attached to housing 142, through connecting means 148, are heating plates 146. The heating plates will provide sufficient heat in the interior to decontaminate any remaining ion source material. The heating elements may be constructed of any highly resistive or similar material that will quickly heat and decontaminate the interior of the ion source. The heating elements are electrically connected to a power source, including an AC or DC source.

After completion of the decontamination step, the cooling of the ion source may be initiated by introducing and circulating a heat absorbing fluid through the outer housing 142. The absorbed heat in the fluid flowing through piping 149 may be transferred to an outside source via a vapor-compression system 150. This embodiment may further be fitted with temperature and gas monitoring sensors as discussed hereinabove and shown as 152. Connecting means 148 provide sufficient contact cooling to cool the non-engaged heating elements 146.

Figure 8A:
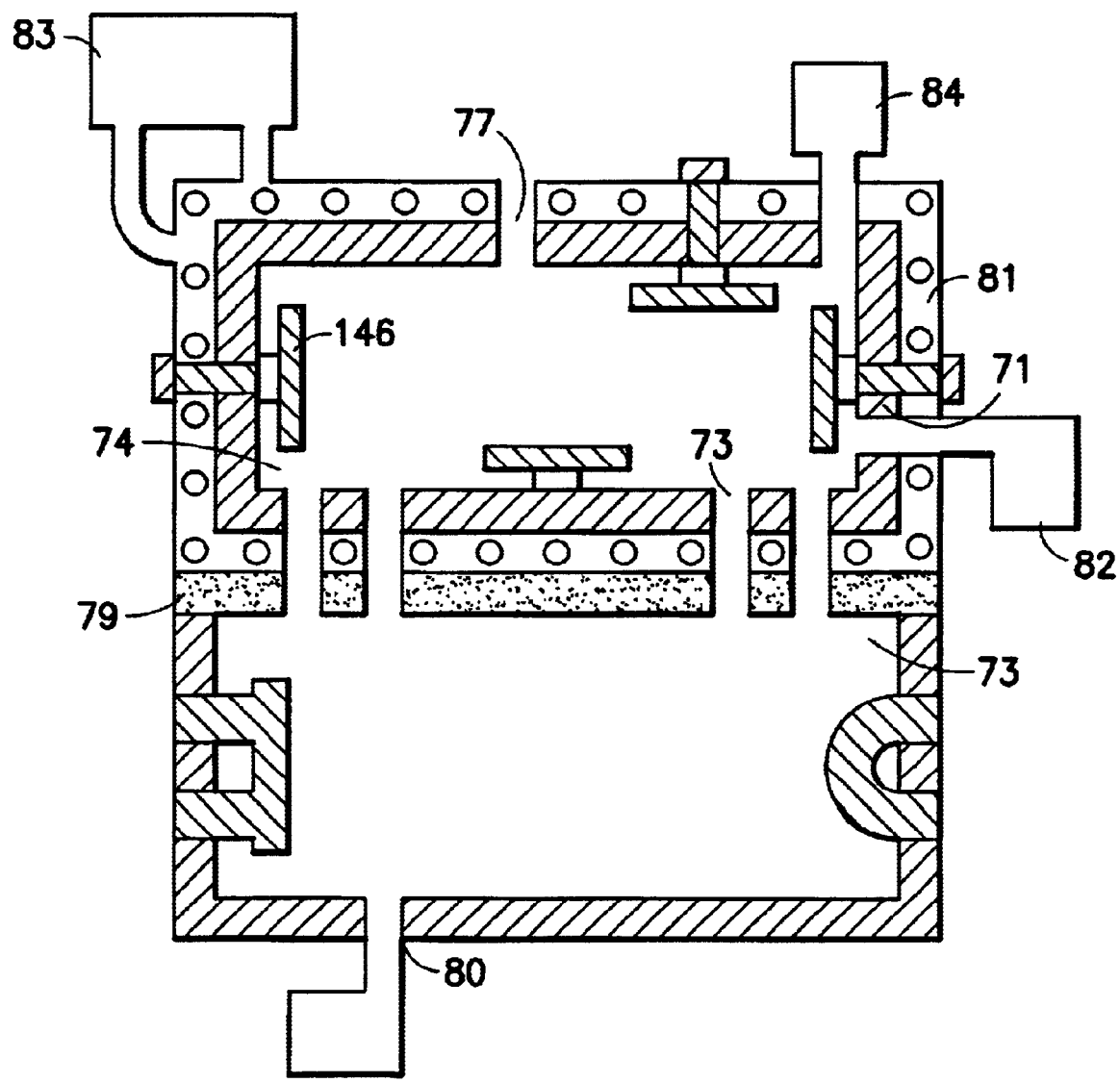
FIG. 8A is a cross-sectional view showing a double chamber charge exchange ion source with a cooling device and additional heating elements.

FIG. 8A shows the double chamber ion source of FIG. 5A equipped with heating elements 146 discussed hereinabove. Heating plates 146 will provide sufficient heat in the interior to decontaminate any remaining ion material. The heating elements may be constructed of any highly resistive or similar material that will quickly heat and decontaminate the interior of the charge exchange chamber. The heating elements are electrically connected to a power source, including an AC or DC source.

While the invention has been described herein with reference to specific features, aspects and embodiments, it will be recognized that the invention may be widely varied, and that numerous other variations, modifications and other embodiments will readily suggest themselves to those of ordinary skill in the art. Accordingly, the ensuing claims are to be broadly construed, as encompassing all such other variations, modifications and other embodiments, within their spirit and scope.

What is claimed is:

1. A temperature controlled ion implanter system, comprising:
    a) an ion source having at least one interior chamber for an ion source material, wherein the interior chamber comprises an ionizing chamber and a charge transfer chamber contiguous to each other and separated by a common divider contiguous to the ionizing chamber and the charge transfer chamber; and
    b) a temperature regulating means contacting at least a portion of the ion source to reduce the temperature within the interior chamber.

2. The ion implanter according to claim 1 wherein the temperature is sufficiently reduced to a temperature whereat the ion source material exhibits reduced vaporization.

3. The ion implanter according to claim 1 wherein the ion source material is $B_{10}H_{14}$.

4. The ion implanter according to claim 1 wherein the temperature regulating means comprises a heat absorbing fluid and a vapor-compression system.

5. The ion implanter according to claim 1 wherein the temperature regulating means reduces the temperature to about 20° C.

6. The ion implanter according to claim 1 further comprising an extraction electrode cooled by a heat absorbing fluid.

7. The ion implanter according to claim 1 wherein the interior chamber has a housing contacting the temperature regulating means, and at least one heating element connected to the housing for heating the interior chamber to reduce vapors of ion source material.

8. The ion implanter according to claim 1 further comprising a temperature monitor inside the interior chamber to determine temperature therein.

9. The ion implanter according to claim 1 further comprising an ion source material vapor detector to monitor levels of vapors.

10. The ion implanter according to claim 1 further comprising a vaporizer communicatively connected to the ion source for vaporizing a solid ion source material, the vaporizer comprising a temperature regulating means to cool the vaporizer to a reduced temperature that substantially reduces vapors of remaining solid ion source material.

11. The ion implanter according to claim 1 wherein the ion source has a gas inlet line connected to a vacuum line, the vacuum line comprising a temperature regulation system to lower the temperature within the tube to a temperature whereat vapors of the ion source material are reduced.

12. A method for cooling an ion implanter to reduce vapors of an ion source material, comprising the steps of:
    a) providing an ion implanter having an ion source with at least one interior chamber for vaporized ion source material, wherein the interior chamber comprises an ionizing chamber and a charge transfer chamber contiguous to each other and separated by a common divider contiguous to the ionizing chamber and the charge transfer chamber; and b) contacting the ion source with a temperature regulating device to cool the interior of the ion source to reduce vapors of ion source material.

13. The method according to claim 12 wherein the temperature is reduced to about 20° C.

14. The ion implanter according to claim 12 wherein the ion source material is $B_{10}H_{14}$.

15. The method according to claim 12 wherein the temperature regulating means comprises a heat absorbing fluid and a vapor-compression system.

16. The method according to claim 12 further comprising cooling an extraction electrode by a heat absorbing fluid.

17. The method according to claim 12 further comprising:

providing at least one heating element connected to the interior chamber of the ion source for heating the ion source material to a sufficient temperature to reduce hazardous vapors of the ion source material therein.

18. The method according to claim 12 further comprising monitoring the temperature within the interior chamber to determine temperature therein.

19. The method according to claim 12 further comprising detecting vapors of the ion source material in the interior chamber to determine levels therein.

20. The method according to claim 12 wherein the ion source further comprises a vaporizer communicatively connected to the ion source for vaporizing a solid ion source material, and cooling the temperature in the vaporizer to substantially reduce hazardous vapors of remaining solid ion source material.

21. A temperature controlled ion implanter system, comprising:

a) an ion source having an interior chamber comprising a plasma generating chamber and charge transfer chamber contiguous to each other and separated by a common divider contiguous to both chambers, wherein the divider has at least one aperture therein for movement of ions and/or gases between the plasma generating chamber and the charge transfer chamber; and b) a temperature regulating means contacting at least a portion of the ion source to reduce the temperature within the interior chamber.

22. The system according to claim 21 wherein the charge transfer chamber is contacted by the temperature regulating means.

23. The system according to claim 22 wherein the temperature regulating means is a cooling system.

24. The system according to claim 23 wherein the divider further comprises an electrically insulating material.

25. The system according claim 22 wherein the apertures are concentrated on the divider near the terminal ends of the divider and the center portion of the divider is devoid of apertures.

26. The system according to claim 22 wherein the divider further comprises a heat shield material.

* * * * *